US007010473B1

(12) United States Patent
Singh

(10) Patent No.: US 7,010,473 B1
(45) Date of Patent: Mar. 7, 2006

(54) METHOD AND APPARATUS FOR REUSING SUBPARTS OF ONE MECHANICAL DESIGN FOR ANOTHER MECHANICAL DESIGN

(75) Inventor: Kapil D. Singh, Westchester, PA (US)

(73) Assignee: Autodesk, Inc., San Rafael, CA (US)

( * ) Notice: Subject to any disclaimer, the term of this patent is extended or adjusted under 35 U.S.C. 154(b) by 758 days.

(21) Appl. No.: 09/239,578

(22) Filed: Jan. 28, 1999

(51) Int. Cl.
*G06G 7/48* (2006.01)
*G06F 17/10* (2006.01)
*G06F 7/60* (2006.01)
*G06T 17/00* (2006.01)

(52) U.S. Cl. ............................... 703/7; 703/2; 345/420

(58) Field of Classification Search .................... 703/7, 703/2; 345/420
See application file for complete search history.

(56) References Cited

U.S. PATENT DOCUMENTS 6,063,126 A 5/2000 Borduin

OTHER PUBLICATIONS

"Challenges in feature-based manufacturing research", Mä ntyläet al., Communications of the ACM, vol. 39, Issue 2, pp. 77-85, Feb. 1996.*

An Introduction to Solid Modeling, Mäntylä. Computer Science Press, ISBN 0-7167-8015-1. 1988.*

"Geometric modeling of solid objects by using a face adjacency graph representation", Ansaldi et al., Proceedings of the SIGGRAPH '85 conference on Computer Graphics, pp. 131-139, 1985.*

"List of Publications: Martti Mäntylä", http://www.cs.hut.fi/~mam/publ.html.*

"Model-Based Orientation-Independent 3-D Machine Vision Techniques", de Figueiredo et al., IEEE Transactions on Aerospace and Electronics Systems, vol. 24, No. 5, pp. 597-607, Sep. 1988.*

Zeid, Ibrahim, "CAD/CAM Theory and Practice," 1991, pp. 388-437, McGraw-Hill, Inc.

* cited by examiner

*Primary Examiner*—Paul L. Rodriguez
*Assistant Examiner*—Ayal Sharon
(74) *Attorney, Agent, or Firm*—Fish & Richardson P.C.

(57) ABSTRACT

A mechanical design reuse method includes having a CAD tool replicates a subset of a first modeling representation of a first mechanical design, in response to having received instructions that identify a subpart of the first mechanical design. The reuse method further includes having the CAD tool merges the replicated subset into a second modeling representation of a second mechanical design to effectuate the reuse of the identified subpart of the first mechanical design in the second mechanical design. In one embodiment, the modeling representations are dependent graphs, and the subsets being replicated and merged are sub-graphs of the dependent graphs. The dependent graphs and sub-graphs include nodes directly associated with the subparts of the designs, nodes on which the directly associated nodes are dependent, and arcs linking the nodes together in accordance with their dependency on each other. In one embodiment, the replicate and merging process also provides for a designer the option to transform certain design variables having constant values assigned to become design variables eligible to have their values variably assigned, and vice versa.

26 Claims, 5 Drawing Sheets

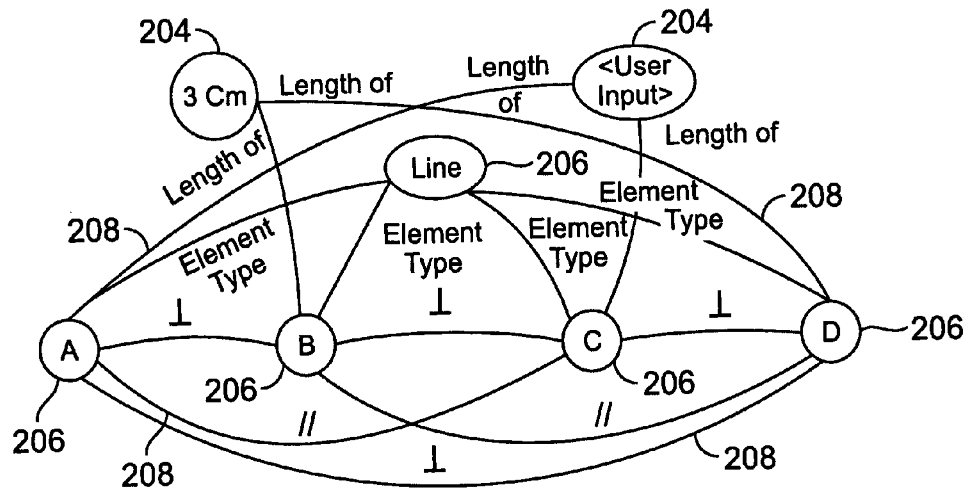
FIG. 2C
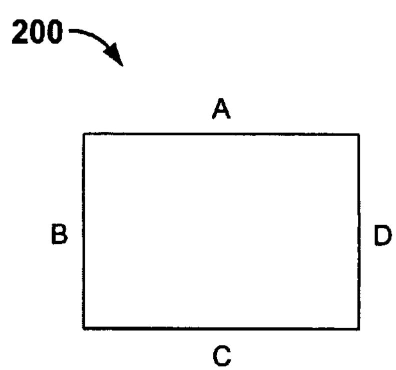
FIG. 2A
| Element ID | Element Type | Length | Constraints |
|---|---|---|---|
| A | Line | <User> | ⊥ B, ⊥ D, //C |
| B | Line | 3 Cm | ⊥ A, ⊥ C, //D |
| C | Line | <User> | ⊥ B, ⊥ D, //A |
| D | Line | 3 Cm | ⊥ A, ⊥ D, //B |
FIG. 2B

METHOD AND APPARATUS FOR REUSING SUBPARTS OF ONE MECHANICAL DESIGN FOR ANOTHER MECHANICAL DESIGN

BACKGROUND OF THE INVENTION

1. Field of the Invention

The present invention relates to the field of computer aided design (CAD). More specifically, the present invention relates to reusing subparts of one mechanical design in another mechanical design.

2. Background Information

Prior art CAD tools typically describe a mechanical design in terms of various geometric shapes, also referred to as "parts". Each part in turn is expressed as a step-by-step recipe incrementally building the various features of the geometric shape, with each step roughly corresponding to a feature. In other words, each part is formed through a linear sequence of steps. For example, a linear step sequence may specify a particular geometric shape is to be formed by starting with a block, cutting a slot at a first location (a first feature), then cutting another angled slot at a second location (a second feature), and so forth. By changing the different design parameters of the "recipe", different embodiments of the geometric shape may be built.

The prior art linear sequence approach to modeling geometric shapes of a mechanical design suffers from at least a number of disadvantages:

a) a significant number of topics or issues associated with the modeling of a mechanical design can not be expressed as features, e.g. equations to create cost, stress and so forth;

b) linear sequences are difficult to manipulate and re-order; and c) linear sequences do not adapt well to reuse analysis, i.e. the reuse of a subpart of one mechanical design in another mechanical design.

The fact that linear sequences do not adapt well to reuse analysis is especially problematic for CAD tools, as increasingly, mechanical designers desire to be able to reuse various subparts of their mechanical designs, in particular, the "standard" or "common" building block subparts employed in otherwise highly complex mechanical designs. Thus, a more effective and efficient approach to expressing mechanical designs and facilitating manipulation of the mechanical designs to allow different subparts of one mechanical design to be easily reused in another, is desired.

SUMMARY OF THE INVENTION

A mechanical design reuse method includes having a CAD tool replicates a subset of a first modeling representation of a first mechanical design, in response to having received instructions that identify a subpart of the first mechanical design. The reuse method further includes having the CAD tool merge the replicated subset into a second modeling representation of a second mechanical design to effectuate the reuse of the identified subpart of the first mechanical design in the second mechanical design.

In one embodiment, the modeling representations are dependent graphs, and the subsets being replicated and merged are sub-graphs of the dependent graphs. The dependent graphs and sub-graphs include nodes directly associated with subparts of the mechanical designs, nodes the directly associated nodes are dependent on, and arcs linking these nodes together in accordance with their dependency on one another. In one embodiment, the replicate and merging process also provides for a designer the option to transform certain design variables having constant values assigned to become design variables eligible to have their values variably assigned, and vice versa.

BRIEF DESCRIPTION OF DRAWINGS

The present invention will be described by way of exemplary embodiments, but not limitations, illustrated in the accompanying drawings in which like references denote similar elements, and in which:

FIGS. 2*a*–2*c* illustrate a mechanical design, its data and its dependent graph in accordance with one example;

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps in turn, in a manner that is most helpful in understanding the present invention, however, the order of description should not be construed as to imply that these operations are necessarily order dependent. In particular, these operations need not be performed in the order of presentation. The phrase "in one embodiment" will be employed from time to time, and it is not intended to necessarily refer to the same embodiment.

Figure 1:
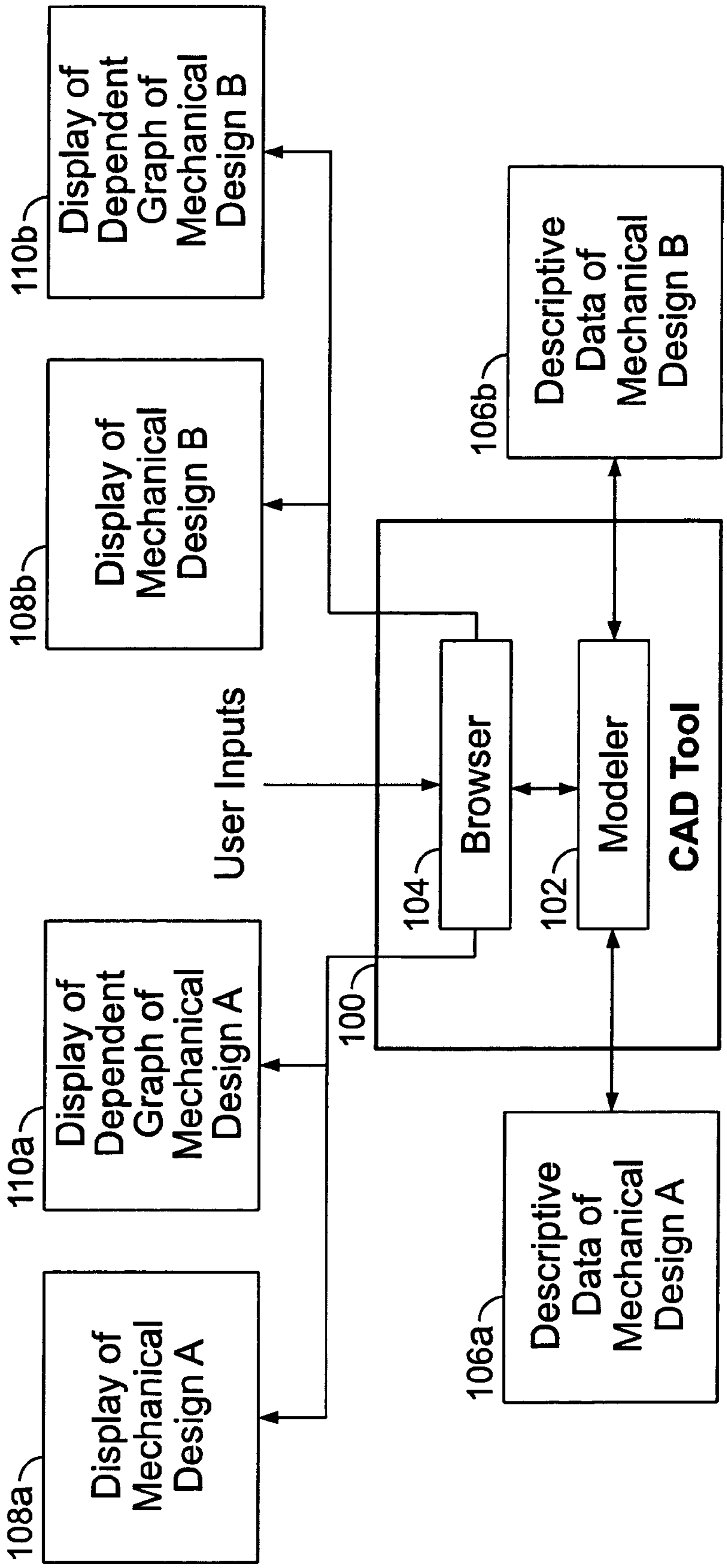
FIG. 1 illustrates an overview of the present invention in accordance with one embodiment.

Refer now to FIG. 1, wherein a block diagram illustrating an overview of the present invention in accordance with one embodiment is shown. As illustrated, CAD tool 100 includes modeler 102 and browser 104. As in prior art, modeler 102 models mechanical designs (hereinafter, simply designs), while browser 104 facilitates display of the modeled designs and related information for the designer, as well as facilitates input by the designer. However, unlike prior art, in accordance with the present invention, modeler 102 models designs employing dependent graphs, and using data 106*a*–106*b* suitably organized for the dependent graph approach, to be described more fully below, whereas browser 104 not only facilitates display of the designs 108*a*–108*b* and their dependant graphs 110*a*–110*b*, but facilitates their displays in a novel coordinated manner. As will be readily apparent from the description to follow, the present invention advantageously enables a designer to be able to efficiently reuse subparts of one design in another design. In particular, the present invention advantageously enables a designer to be able to efficiently explore the interrelationship between various subparts of a modeled design and its dependant graph, thereby allowing the designer to efficiently leverage on the reuse support offered by CAD tool 100.

Except for the teachings of the present invention incorporated, modeler 102 and browser 104 are otherwise intended to represent a broad range of these elements known in the art. Thus, except for the teachings incorporated, which are described in more details below, modeler 102 and browser 104 will not be otherwise further described.

Refer now to FIGS. 2*a*–2*c*, wherein three diagrams illustrating the relationship between an example modeled design, its data and dependent graph, in accordance with one embodiment, are shown. As illustrated in FIG. 2*a*, example design 200 is a simple rectangle having four sides A through D. FIG. 2*c*, illustrates example dependent graph 202 employed by modeler 102 to model design 200. As illustrated, example dependent graph 202 includes nodes 204, nodes 206, and arcs 208 linking nodes 204 and 206 to one another. Nodes 204 and 206 represent "atomic" design variables of example design 200, i.e. they represent the "lowest level" information building blocks for modeling example design 200. Examples of these "lowest level" information building blocks are numbers, lines, points, and so forth. Nodes 204 are referred to as independent nodes representing independent design variables, whereas nodes 206 are referred to as dependent nodes representing dependent design variables. Dependent design variables are those design variables that cannot be resolved until other design variables are resolved first. Thus, arcs 208 represent dependencies between the design variables represented by nodes 204 and 206. For example, nodes 206 directly representing lines A–D of rectangle 200 are linked to nodes 204 defining lines A–D's dimension, as well as to one another, by arcs 208 representing the "length of", perpendicular, and parallel relationships between these nodes. Two example types of "dimension" nodes 204 are illustrated, "3 cm" and "<user input>". Nodes 206 linked to "3 cm" node 204 represent the length of the lines represented by the particular nodes 206 are invariantly assigned the value "3 cm", whereas nodes 206 linked to "<user input>" node 204 represent the length of the lines represented by the particular nodes 206 are eligible to have their lengths variably assigned by the designer.

As shown in FIG. 2*b*, for the illustrated embodiment, the descriptive data of example design 200 processed by modeler 102 to generate dependent graph 202 are organized in a tabular manner. As those skilled in the art will appreciate that any one of a number of other known data organizations may also be employed to store the descriptive data of a design.

Furthermore, while for ease of understanding, the interrelationships between a design, its data and its dependent graph have been illustrated with the simple example design of a rectangle, as those skilled in the art will appreciate that the principles are nevertheless fully scalable to highly complex designs having large quantities of data and complicated dependent graphs.

Figure 3:
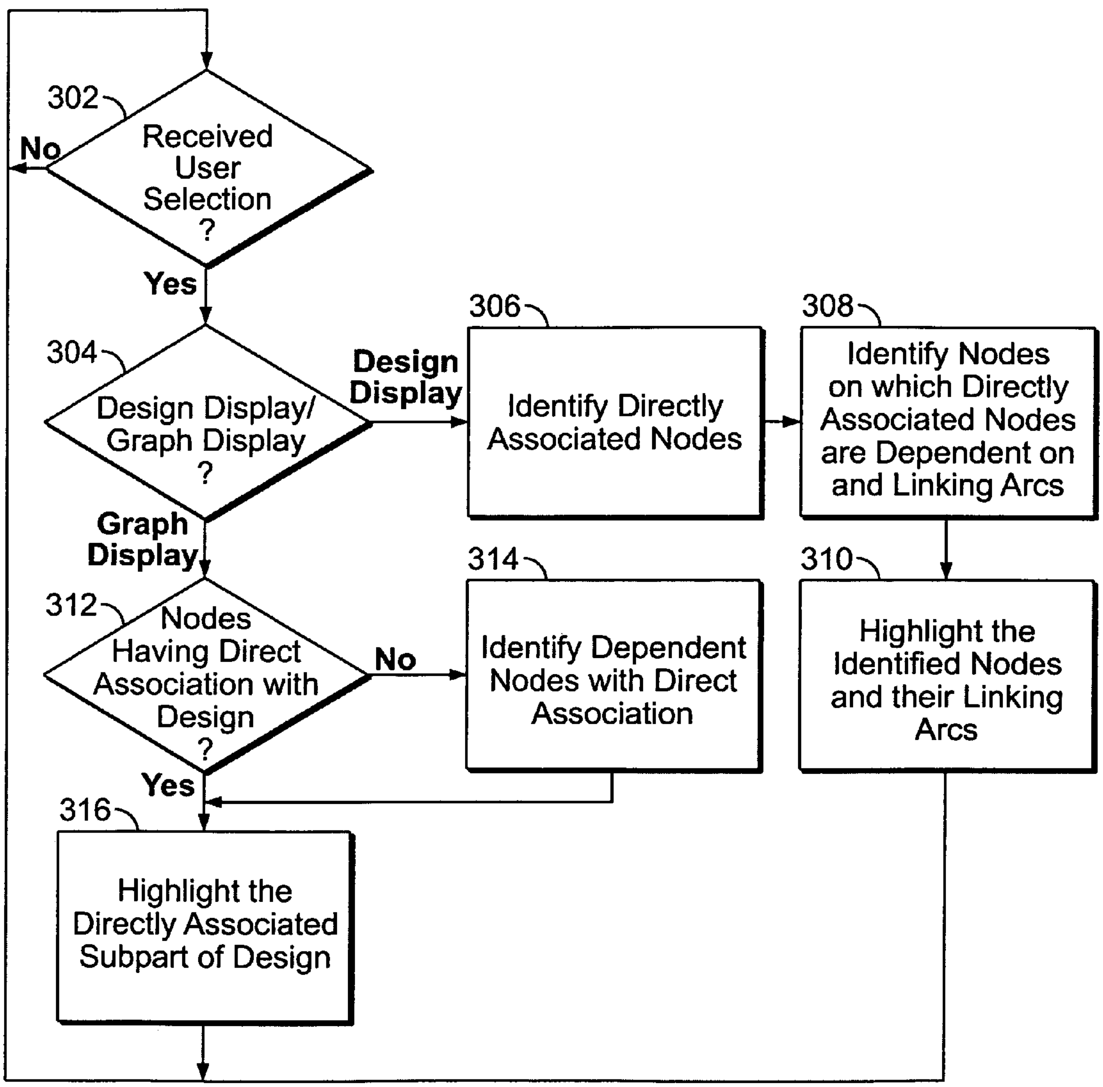
FIG. 3 illustrates the method of the present invention for viewing a mechanical design and its dependent graph in accordance with one embodiment.

Refer now to FIG. 3, wherein a flow diagram illustrating the operational flow of browser 104 for facilitating exploration of a modeled design and its dependent graph, in accordance with one embodiment, is shown. As illustrated, at 302, browser 104 receives certain selection inputs from the user. The selection may be denoted and communicated to browser 104 in any one of a number of techniques known in the art, e.g. using a cursor control device and posting messages for browser 104 responsive to certain predetermined cursor control device events. In response, at 304, browser 104 determines whether the selections were made in reference to the design displayed 108*a*/108*b* or in reference to their dependent graphs 110*a*/110*b*. The determination may also be made in accordance with any one of a number of techniques known in the art, e.g. by having the messages include identification information of the "focus" window at the time the cursor control device events arose.

If it is determined at 304 that the selections were made in reference to the design displayed 108*a*/108*b*, at 306, browser 104 identifies the dependent graph nodes that are directly associated with the subpart of the mechanical design selected. Additionally, at 308, browser 104 further identifies all other dependent graph nodes to which the directly associated nodes are dependent on, directly or indirectly, and the arcs that link these nodes to one another. The identification process may be implemented using any one of a number of known "tracing" techniques, to systematically follow the arcs to all the independent nodes on which the directly associated nodes are dependent on. At 310, browser 104, refreshes dependant graph display 110*a*/110*b* to reflect the nodes and arcs identified.

Similarly, if it is determined at 304 that the selections were made in reference to the dependent graph displayed 110*a*/110*b*, at 312, browser 104 determines whether the graphical elements selected are directly associated with specific subparts of the mechanical design. If the graphical elements selected are not directly associated with specific subpart of the mechanical design, at 314, browser 104 follows the arcs radiating from the selected graphical elements to identify the "nearest" directly associated nodes. Upon either having received identifications of the directly associated nodes directly, or determined the directly associated nodes, at 316, browser 104 refreshes design display 108*a*/108*b* to highlight the directly associated subparts.

Operations 302–316 may be repeated as many times as it is necessary, alternating between the two basic paths as desired, i.e. selecting subparts of a design and selecting graphical elements of the dependent graph, to facilitate a designer in exploring and understanding a design. As those skilled in the art will appreciate, the above described novel coordinated approach to facilitate viewing of a design and its dependent graph is particularly useful for facilitating a designer in exploring the various subparts of a design, and reusing selected ones of the subparts in another design.

Figure 4:
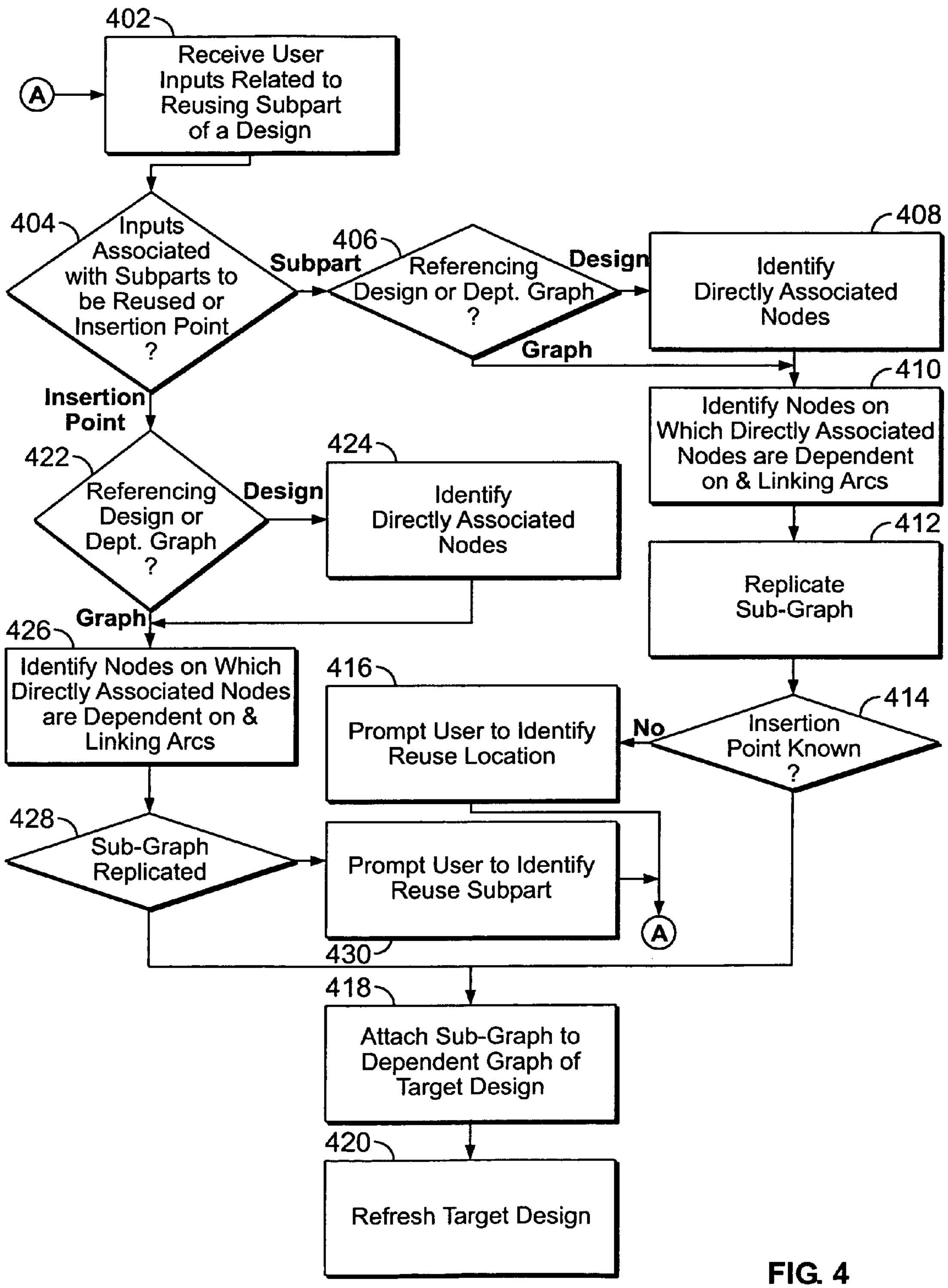
FIG. 4 illustrates the method of the present invention for reusing subparts of a mechanical design in another mechanical design in accordance with one embodiment.

Referring now to FIG. 4, wherein a flow diagram illustrating the operational flow of modeler 102 for facilitating reuse of a subpart of one design in another design, in accordance with one embodiment, is shown. As illustrated, at 402, modeler 102 receives (e.g. by way of browser 104) certain design subpart reuse related identification inputs from the user. In response, modeler 102, at 404, determines whether the inputs are associated with the identification of a subpart of one design to be reused in another design, or the inputs are associated with the identification of a point or an area of a target design on which a subpart of another design is to be inserted or reused.

If it is determined at 404 that the inputs are associated with the identification of a subpart of one design to be reused in another design, at 406, modeler 102 further determines if the inputs were provided referencing the dependent graph or the modeled design itself. If it is determined at 406 that the inputs were provided referencing the modeled design itself, at 408, modeler 102 first identifies the dependent graph nodes directly associated with the selected subpart of the design to be reused. If it is determined at 406 that the inputs were provided referencing the dependent graph or upon identifying the directly associated nodes at 408, at 410, modeler 102 identifies the dependent graph nodes on which the directly associated nodes are dependent, directly as well as indirectly, and the arcs linking these nodes to one another. As described earlier, the determination process may be implemented using any one of a number of known "tracing" techniques, to systematically follow the linking arcs to the independent nodes on which the directly associated nodes are dependent. Once all the dependent and independent nodes, and the arcs linking them are identified for the selected subpart to be reused, at 412, modeler 102 replicates the sub-graph, i.e. creating a copy of the identified dependent and independent nodes, and their linking arcs.

Having replicated the sub-graph, at 414, modeler 102 determines if the insertion points in the dependent graph of the target design have been determined. If the insertion points have not been identified, at 416, modeler 102 in cooperation with browser 104 prompts the user to identify the point or area where the subpart is to be reused (i.e. inserted). If the insertion points have been identified, at 418, modeler 102 attaches the replicated sub-graph to the dependent graph of the target design to reuse the selected subpart with the target design. Lastly, at 420, modeler 102 refreshes target design's display 108*a*/108*b* as well as the dependent graph display 110*a*/110*b*.

Back at 404, if it was determined that the inputs received were associated with identifying the insertion point or area of a target design, at 422, modeler 102 further determines whether the inputs were provided referencing target design's display 108*a*/108*b* or referencing its dependent graph display 110*a*/110*b*. If the inputs were provided referencing target design's display 108*a*/108*b*, at 424, modeler 102 first identifies the dependent graph nodes directly associated with the identified insert point or area of the target design. Upon either determining that the inputs were provided referencing the dependent graph or having identified the dependent graph nodes directly associated with the insertion point/area, at 426, modeler 102, further identifies other dependent graph nodes on which the identified/directly associated insertion point nodes are directly or indirectly dependent, and the arcs linking these nodes to each other.

Having identified the insertion points in the dependent graph of the target design, at 428, modeler 102 determines if the sub-graph modeling the subpart to be reused has been generated (i.e. replicated). If the sub-graph has not been generated, at 430, modeler 102 in cooperation with browser 104 prompts the user to identify the subpart to be reused. Upon receipt of the identification of the subpart to be reused, the process continues as described earlier. If the sub-graph has been generated, modeler 102 proceeds with the attachment and refresh operations of 418 and 420 as described earlier.

In one embodiment, modeler 102 further provides a user with the opportunity to transform selected ones of the design variables (nodes) from having assigned constant values to being eligible to have their values variably assigned, or vice versa. In one embodiment, modeler 102 offers the transformation option to the user, one applicable design variable at a time, as it processes the independent nodes while performing attachment operation 418.

Figure 5:
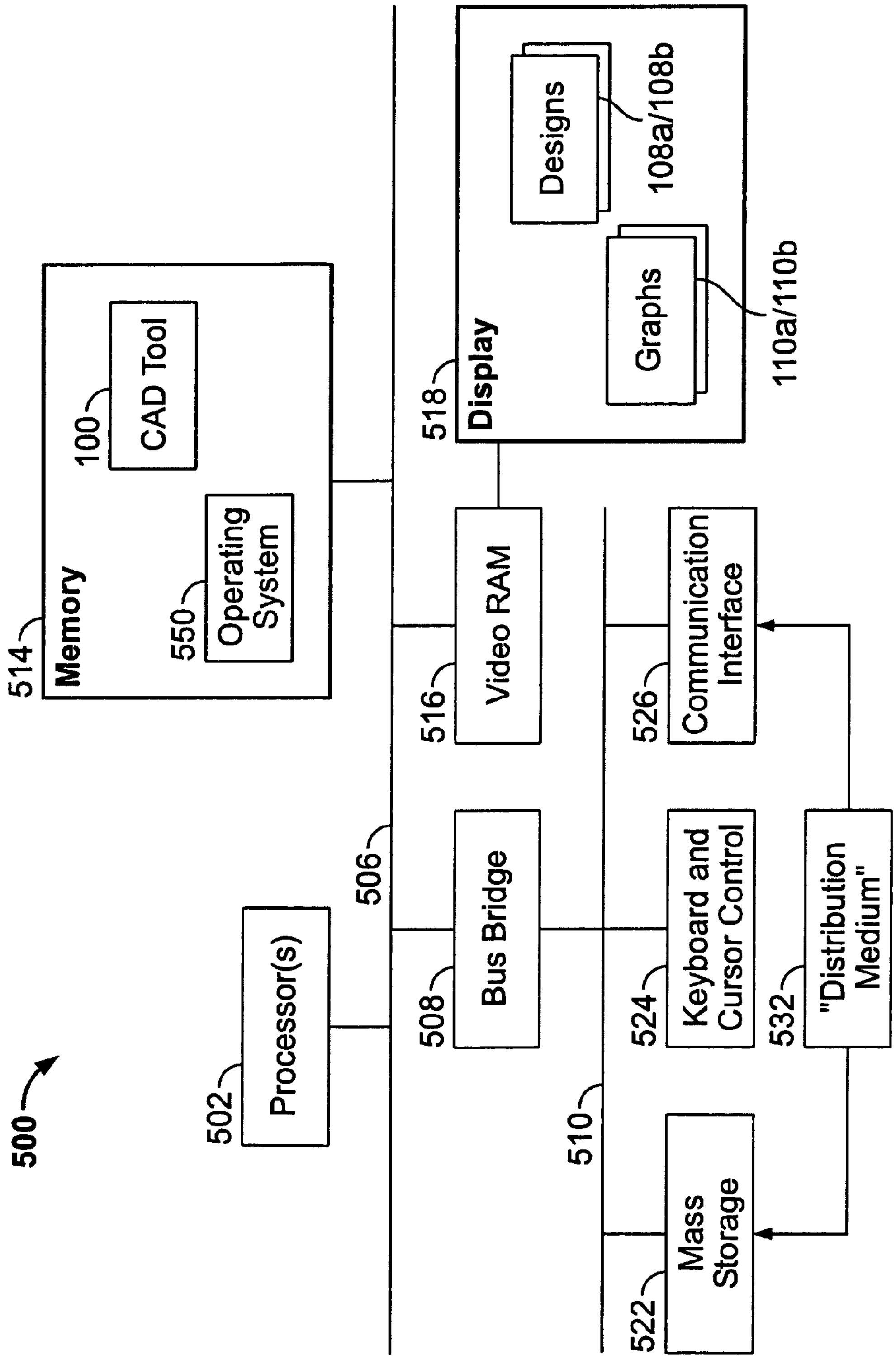
FIG. 5 illustrates one embodiment of a computer system suitable for programming with instructions implementing the present invention.

FIG. 5 illustrates one embodiment of a computer system suitable to be programmed with programming instructions implementing the CAD tool incorporated with the teachings of the present invention. As shown, for the illustrated embodiment, computer 500 includes processor 502, system bus 506 and I/O bus 510. System bus 506 and I/O bus 510 are bridged by bus bridge 508. Coupled to system bus 506 are system memory 514 and video memory 516, against which video display 518 is coupled. Coupled to I/O bus 510 are disk drive 522, keyboard and pointing device 524, and communication interface 526. Most importantly, computer 500 is programmed with CAD tool 100 incorporated with the teachings of the present invention as described earlier, and operating system 550.

The elements perform their conventional functions known in the art, except CAD tool 100 which performs its otherwise conventional functions in accordance with the present invention. In particular, disk drive 522 and system memory 514 are used to store permanent and working copies of CAD tool 100 and operating system 550, and video display 518 is used to display e.g. design displays 108*a*/110*b* and dependent graph displays 110*a*/110*b*. The permanent copies may be pre-loaded into disk drive 522 in a factory, loaded from distribution medium 532, or down loaded from a remote distribution source (not shown). Distribution medium 532 may be a tape, a CD, a DVD or other storage medium of the like. The constitutions of these elements are known. Any one of a number of implementations of these elements known in the art may be used to form computer system 500. In alternate embodiments, other components may also be used in addition to or in lieu of the components described, e.g. additional processors. In selected ones of these multi-processor embodiments, execution of the programming instructions implementing CAD tool 100 incorporated with the teachings of the present invention may also be distributed among the processors.

In general, those skilled in the art will recognize that the present invention is not limited by the details described, instead, the present invention can be practiced with modifications and alterations within the spirit and scope of the appended claims. The description is thus to be regarded as illustrative instead of restrictive on the present invention.

Thus, a method and an apparatus for reusing a subpart of one mechanical design in another mechanical design have been described.

What is claimed is:

1. In a computer system, a method of operation comprising:

replicating a sub-graph from a first dependent graph of a first mechanical design of a computer aided design (CAD) tool, the first dependent graph having modeling information of the first mechanical design and the replicated sub-graph having modeling information of a subpart of the first mechanical design; and merging the replicated sub-graph into a second dependent graph of a second mechanical design of the CAD tool to reuse the subpart of the first mechanical design in the second mechanical design.

2. The method of operation of claim 1 further comprising receiving identification of the subpart of the first mechanical design, and in response, identifying the sub-graph for replication.

3. The method of operation of claim 2, wherein said first dependent graph includes a first plurality of nodes correspondingly represent a first plurality of design variables of the first mechanical design, and a first plurality of arcs linking the first plurality of node's in accordance with the first plurality of design variables' dependency on one another; and said identification of the sub-graph for replication comprises correlating said received identification of the subpart to one or more nodes of said first plurality of nodes directly associated with the subpart, and following applicable ones of said first plurality of arcs to identify all other nodes of said first plurality of nodes to which the directly associated nodes are directly or indirectly dependent on.

4. The method of operation of claim 3 wherein said replication comprises copying said directly associated nodes, said nodes on which the directly associated nodes are dependent on, and the arcs linking these nodes to one another.

5. The method of operation of claim 4, wherein selected ones of the design variables of said replicated sub-graph are set to constant values, while others are eligible to have values variably assigned; and the method of operation further comprises receiving instructions to transform selected ones of the design variables set to constant values to design variables eligible for having values variably assigned, or to transform selected ones of the design variables eligible for having values variably assigned to having constant values assigned.

6. The method of operation of claim 1 further comprising receiving identification of a point or an area of the second mechanical design to reuse the subpart of the first mechanical design in the second mechanical design.

7. The method of operation of claim 6, wherein said second dependent graph includes a second plurality of nodes correspondingly represent a second plurality of design variables of the second mechanical design, and a second plurality of arcs linking the second plurality of nodes in accordance with the second plurality of design variables' dependency on one another; and said merging comprises correlating said received identification of the point/area to one or more nodes of said second plurality of nodes directly associated with the identified point/area, and attaching the replicated sub-graph to the second dependent graph by selectively linking nodes of the replicated sub-graph to the correlated nodes of the second dependent graph.

8. An article of manufacture comprising:

a recordable medium having recorded thereon a plurality of programming instructions for use to program an apparatus to enable the apparatus to be able to replicate a sub-graph from a first dependent graph of a first mechanical design of a computer aided design (CAD) tool, the first dependent graph having modeling information of the first mechanical design and the replicated sub-graph having modeling information of a subpart of the first mechanical design, and to be able to merge the replicated sub-graph into a second dependent graph of a second mechanical design of the CAD tool to reuse the subpart of the first mechanical design in the second mechanical design.

9. The article of claim 8, wherein the programming instructions further enable the apparatus to be able to receive identification of the subpart of the first mechanical design, and in response, identify the sub-graph for replication.

10. The article of claim 9, wherein said first dependent graph includes a first plurality of nodes correspondingly represent a first plurality of design variables of the first mechanical design, and a first plurality of arcs linking the first plurality of nodes in accordance with the first plurality of design variables' dependency on one another; and the programming instructions further enable the apparatus to be able to identify the sub-graph for replication by correlating said received identification to one or more nodes of said first plurality of nodes directly associated with the subpart, and then following applicable ones of said first plurality of arcs to identify all other nodes of said first plurality of nodes to which the directly associated nodes are directly or indirectly dependent on.

11. The article of claim 10 wherein the programming instructions further enable the apparatus to be able to replicate the identified sub-graph by copying said directly associated nodes, said nodes the directly associated nodes are dependent on, and the arcs linking these nodes to one another.

12. The article of claim 11, wherein selected ones of the design variables of said replicated sub-graph are set to constant values, while others are eligible to have values variably assigned; and the programming instructions further enable the apparatus to be able to receive instructions to transform selected ones of the design variables set to constant values to design variables eligible for having values variably assigned, or to transform selected ones of the design variables eligible for having values variably assigned to having constant values assigned.

13. The article of claim 8, wherein the programming instructions further enable the apparatus to be able to receive identification of a point or an area of the second mechanical design to reuse the subpart of the first mechanical design in the second mechanical design.

14. The article of claim 13, wherein said second dependent graph includes a second plurality of nodes correspondingly represent a second plurality of design variables of the second mechanical design, and a second plurality of arcs linking the second plurality of nodes in accordance with the second plurality of design variables' dependency on one another; and the programming instructions further enable the apparatus to be able to correlate the received identification of the point/area to one or more nodes of said second plurality of nodes directly associated with the identified point/area, and to attach the replicated sub-graph to the second dependent graph by selectively linking nodes of the replicated sub-graph to the correlated nodes of the second dependent graph.

15. The article of claim 8, wherein the programming instructions are integral part of a computer aided design tool.

16. An apparatus comprising:

at least one storage medium having stored therein a first and a second plurality of programming instructions; and at least one processor coupled to the at least on storage medium to execute the first plurality of programming instructions to replicate a sub-graph from a first dependent graph of a first mechanical design of a computer aided design (CAD) tool, the first dependent graph having modeling information of the first mechanical design and the replicated sub-graph having modeling information of a subpart of the first mechanical design, and to execute the second plurality of programming instructions to merge the replicated sub-graph into a second dependent graph of a second mechanical design of the CAD tool to reuse the subpart of the first mechanical design in the second mechanical design.

17. The apparatus of claim 16, wherein the at least one processor further executes the second plurality of programming instructions to receive identification of the subpart of the first mechanical design, and in response, identify the sub-graph for replication.

18. The apparatus of claim 17, wherein said first dependent graph includes a first plurality of nodes correspondingly represent a first plurality of design variables of the first mechanical design, and a first plurality of arcs linking the first plurality of nodes in accordance with the first plurality of design variables' dependency on one another; and the at least one processor further executes the first plurality of programming instructions to identify the sub-graph for replication by correlating said received identification of the subpart to one or more nodes of said first plurality of nodes directly associated with the identified subpart, and to follow applicable ones of said first plurality of arcs to identify all other nodes of said first plurality of nodes to which the directly associated nodes are directly or indirectly dependent on.

19. The apparatus of claim 18 wherein the at least one processor further executes the first plurality of programming instructions to replicate the identified sub-graph by copying said directly associated nodes, said nodes on which the directly associated nodes are dependent on, and the arcs linking the these nodes to one another.

20. The apparatus of claim 19, wherein selected ones of the design variables of said replicated sub-graph are set to constant values, while others are eligible to have values variably assigned; and the at least one processor further executes the second plurality of programming instructions to receive instructions to transform selected ones of the design variables set to constant values to design variables eligible for having values variably assigned, or to transform selected ones of the design variables eligible for having values variably assigned to having constant values assigned.

21. The apparatus of claim 16, wherein the at least one processor further executes the second plurality of programming instructions to receive identification of a point or an area of the second mechanical design to reuse the subpart of the first mechanical design in the second mechanical design.

22. The apparatus of claim 21, wherein said second dependent graph includes a second plurality of nodes correspondingly represent a second plurality of design variables of the second mechanical design, and a second plurality of arcs linking the second plurality of nodes in accordance with the second plurality of design variables' dependency on one another; and the at least one processor further executes the second plurality of programming instructions to correlate the received identification of the point/area to one or more nodes of said second plurality of nodes directly associated with the identified point/area, and to attach the replicated sub-graph to the second dependent graph by selectively linking nodes of the replicated sub-graph to the correlated nodes of the second dependent graph.

23. The apparatus of claim 16, wherein the at least one processor consists of a processor executing both the first and second plurality of programming instructions.

24. The apparatus of claim 16, wherein the at least one processor comprises a first and a second processor communicatively coupled to each other to correspondingly execute the first and second plurality of programming instructions.

25. An apparatus comprising:

means to replicate a subset of a first modeling representation of a first mechanical design responsive to instructions identifying a subpart of the first mechanical design of a computer aided design (CAD) tool; and means to merge the replicated subset into a second modeling representation of a second mechanical design of the CAD tool to reuse the identified subpart of the first mechanical design in the second mechanical design.

26. In a computer system, a method of operation comprising the steps of:

replicating a subset of a first modeling representation of a first mechanical design of a computer aided design (CAD) tool responsive to instructions identifying a subpart of the first mechanical design; and merging the replicated subset into a second modeling representation of a second mechanical design of the CAD tool to reuse the identified subpart of the first mechanical design in the second mechanical design.

* * * * *